(12) United States Patent
LaBerge et al.

(10) Patent No.: US 6,185,207 B1
(45) Date of Patent: Feb. 6, 2001

(54) COMMUNICATION SYSTEM HAVING A LOCAL AREA NETWORK ADAPTER FOR SELECTIVELY DELETING INFORMATION AND METHOD THEREFOR

(75) Inventors: Peter Anthony LaBerge, Apex; Joseph Franklin Logan; Joseph Gerald McDonald, both of Raleigh; Gregory Francis Paussa, Cary, all of NC (US)

(73) Assignee: International Business Machines Corporation, Armonk, NY (US)

( * ) Notice: Under 35 U.S.C. 154(b), the term of this patent shall be extended for 0 days.

(21) Appl. No.: 08/878,702

(22) Filed: Jun. 19, 1997

(51) Int. Cl.[7] ............................ H04L 12/28; H04L 12/54; H03M 13/00
(52) U.S. Cl. ...................... 370/392; 370/401; 370/428; 714/751
(58) Field of Search ...................... 370/401–402, 370/403, 404, 405, 419–420, 421, 338–389, 392, 428; 371/30–35; 714/37.6, 37.7, 40.11, 43.1, 41, 746–751, 780, 781, 763, 774, 786

(56) References Cited

U.S. PATENT DOCUMENTS

| | | | |
|---|---|---|---|
| 4,809,265 | * 2/1989 | Hart et al. | 370/401 X |
| 4,991,133 | 2/1991 | Davis et al. | 364/900 |
| 5,048,012 | 9/1991 | Gulick et al. | 370/77 |
| 5,153,884 | 10/1992 | Lucak et al. | 371/32 |
| 5,155,857 | 10/1992 | Kunisaki et al. | 395/800 |
| 5,191,585 | 3/1993 | Velazquez | 371/53 |
| 5,260,936 | 11/1993 | Bardet et al. | 370/61 |
| 5,347,514 | 9/1994 | Davis et al. | 370/60 |
| 5,388,109 | 2/1995 | Hodge et al. | 371/53 |
| 5,400,326 | * 3/1995 | Smith | 370/401 |
| 5,557,608 | 9/1996 | Calvignac et al. | 370/60 |
| 5,657,314 | * 8/1997 | McClure et al. | 370/401 |
| 5,815,668 | * 9/1998 | Hashimoto | 370/401 |
| 5,917,821 | * 6/1999 | Gobuyan et al. | 370/401 |
| 5,956,335 | * 9/1999 | Backes et al. | 370/401 X |
| 5,963,556 | * 10/1999 | Varghese et al. | 370/401 |
| 6,006,275 | * 12/1999 | Picazo, Jr. et al. | 370/401 |
| 6,014,380 | * 1/2000 | Hendel et al. | 370/392 |
| 6,023,563 | * 2/2000 | Shani | 370/401 |

\* cited by examiner

*Primary Examiner*—Chau Nguyen
*Assistant Examiner*—Phuongchau Ba Nguyen
(74) *Attorney, Agent, or Firm*—Kelly K. Kordzik; Joscelyn G. Cockburn

(57) ABSTRACT

A LAN adapter is implemented in the communication system to selectively exclude four bytes of the CRC value appended to an end of a frame's information field through the use of a configuration bit in a register. By programming this configuration bit to have a specific logic value, the four-bytes of the CRC value may be selectively copied, together with the data in the frame, into a destination computer system's main memory. Additionally, regardless of the setting of this configuration bit, the four-bytes of the CRC value will always be used to check the integrity of the data in the frame. Stated another way, the configuration bit will only affect whether the four-bytes of the CRC value will be transferred as part of the frame after the CRC check operation has been performed.

25 Claims, 3 Drawing Sheets

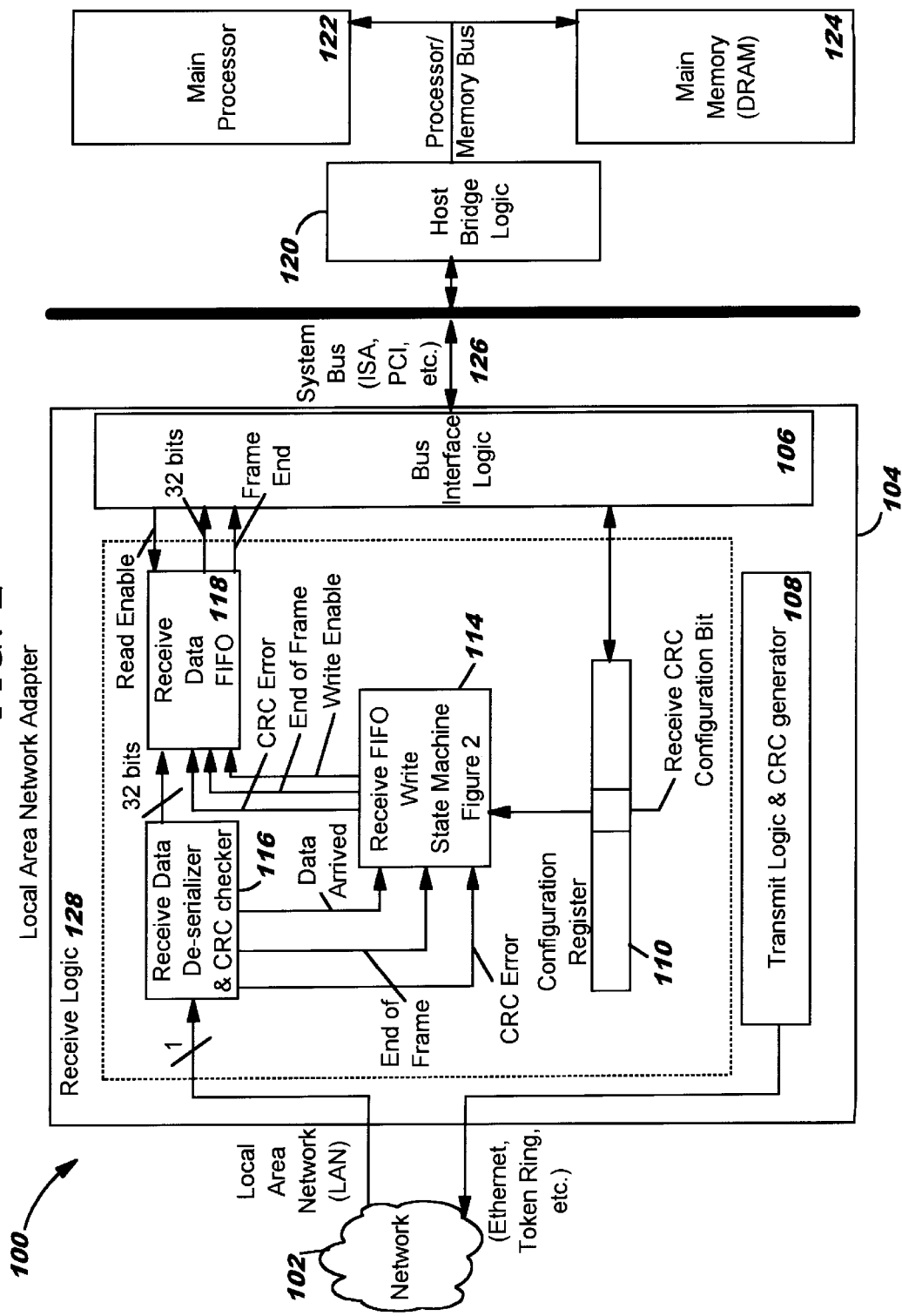

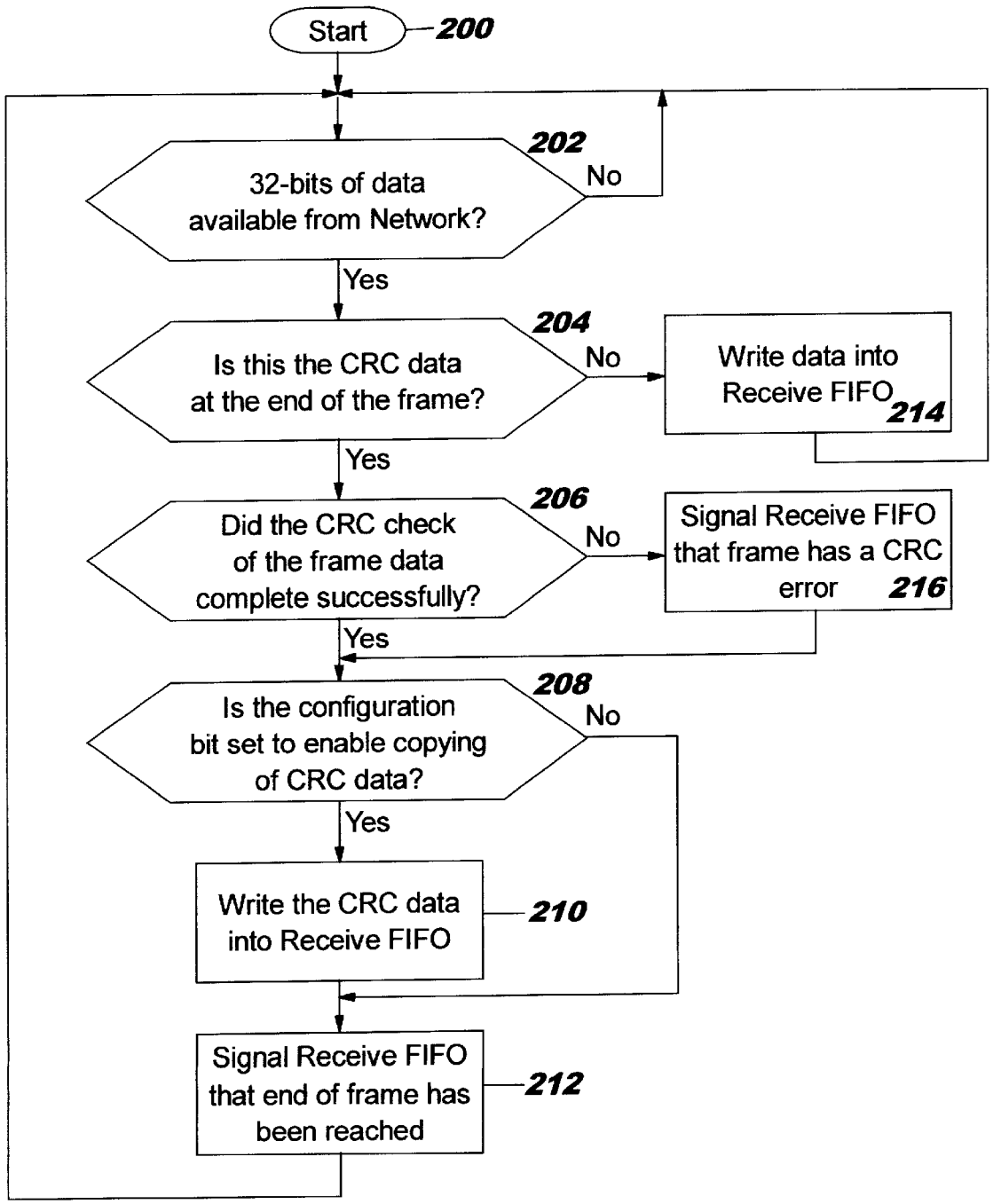

COMMUNICATION SYSTEM HAVING A LOCAL AREA NETWORK ADAPTER FOR SELECTIVELY DELETING INFORMATION AND METHOD THEREFOR

TECHNICAL FIELD

The present invention relates in general to local area network adapters, and in particular, to local area network adapters which receive cyclic redundancy check (CRC) data.

BACKGROUND INFORMATION

In modern computing environments, computer systems are often interconnected using local area networks, also referred to as LANs. LANs allow computer-to-computer and processor-to-processor communications. In many environments, this networking concept is extended so that multiple LANs are networked together through the use of intermediate nodes or gateways. Inherent in the communication between computers or data processing systems is a protocol which transfers data and control information necessary for proper communication of the systems. When this communication protocol is utilized, the information is transferred in packets, or frames. Within these packets or frames, communications-related control information and data values are typically transmitted.

The data information is the actual data that one device is communicating to another over the LAN. The control information is the information required by the communications protocol to send the packet over the network from one computing system to another. Such control information is usually one of a "header" or a "trailer" of a packet. Control information in the header is generally interpreted by a communications protocol processor before the packet is passed on to a receiving application. Control information typically included in the header of a packet includes information such as a source address, a destination address and routing information. Furthermore, control information in a trailer of a packet generally includes cyclic redundancy checking (CRC) information. Typically, a transmitting data processing system sends a packet of data information and then appends to it an appropriate computed CRC value. At the receiving data processing system, a receiving node will calculate its own CRC value and compare its CRC value with the CRC value received from the data transmitting system. When the two are different, this indicates that an error occurred during transmission of the data packet.

While this protocol is typically used by most data processing applications, this protocol also limits the performance which may be achieved by a system. The use of the CRC value typically requires at least the final four bytes of a packet, or frame, to be used to provide a CRC value. In a communications environment which has been developed and utilized extensively, every savings and performance improvement is necessary and significant. Therefore, the requirement that the final four bytes of a frame always be used for providing a CRC value may prove to be a necessary evil.

Therefore, a need exists for a communication system which provides for improvements in a communication system involving a LAN, while still maintaining the error checking capability of the CRC value.

SUMMARY OF THE INVENTION

The previously mentioned needs are fulfilled with the present invention. Accordingly, there is provided, in a first form, a local area network adapter. The local area network adapter includes an input circuit for receiving a first plurality of information values and an output circuit for selectively transferring the first plurality of information values. The local area network adapter also includes a configuration register for storing a configuration value. The configuration value is used to selectively enable the output circuit to transfer a portion of the first plurality of information values when the configuration value is in a first logic state.

Additionally, there is provided, in a second form, a method of operating a local area network adapter. The method includes the steps of receiving a first plurality of information values and storing a configuration value in a register. The method also includes the step of selectively enabling an output circuit to transfer a portion of the first plurality of information values when the configuration value is in a first logic state.

Furthermore, there is provided, in a third form, a communication system. The communication system includes a first local area network adapter. The first local area network adapter includes an input circuit for receiving a first plurality of information values and an output circuit for selectively transferring a second plurality of information values. The first local area network adapter also includes a first configuration register for storing a first configuration value. The first configuration value enables the output circuit to transfer a portion of the first plurality of information values as the second plurality of information values when the first configuration value is in a first logic state. The communication system also includes a memory connected to the output circuit for storing the second plurality of information values.

There is also provided, in a fourth form, a method of operating a communication system. The method includes the steps of receiving a first plurality of information values in a first local area network adapter and storing a first configuration value in a first configuration register in the first local area network adapter. The method also includes the steps of enabling an output circuit to transfer a portion of the first plurality of information values as the second plurality of information values when the first configuration value is in a first bit logic state and a step of storing the second plurality of information values in a memory.

These and other features, and advantages, will be more clearly understood from the following detailed description taken in conjunction with the accompanying drawings. It is important to note the drawings are not intended to represent the only form of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 illustrates, in block diagram form, a communication system in accordance with one embodiment of the present invention; and FIG. 3 illustrates, in flow chart form, a state machine in accordance with one embodiment of the present invention.

DETAILED DESCRIPTION

Figure 1:
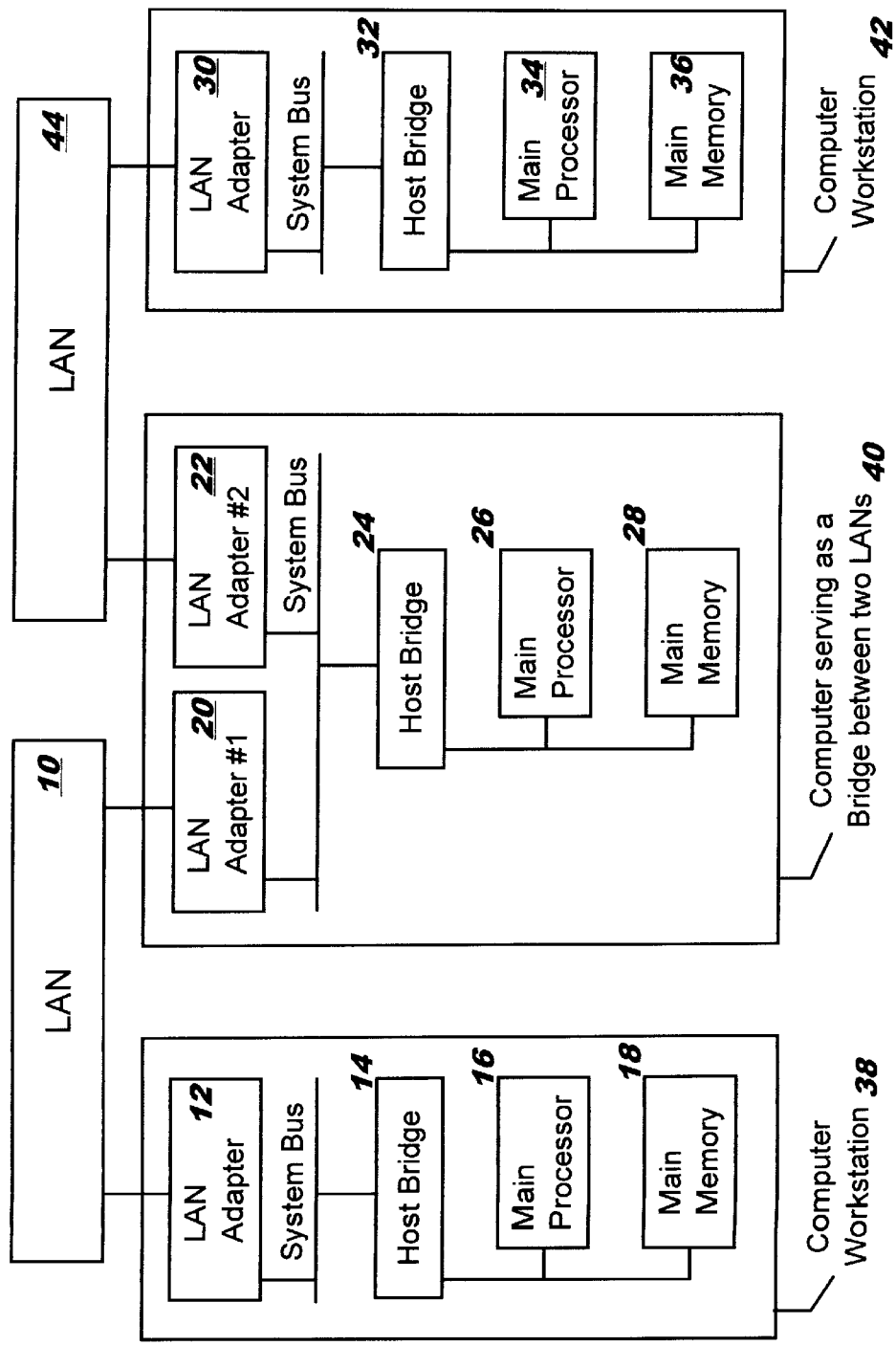
FIG. 1 illustrates, in block diagram form, a communication system in accordance with one embodiment to the present invention.

The present invention implements a LAN adapter which selectively excludes the four bytes of a CRC value appended to the end of a frame's information field through the use of a configuration bit in a register. By programming this configuration bit to have a specific logic value, the four-bytes of the CRC value may be selectively copied, together with the data in a frame, into a destination computer system's main memory. Additionally, regardless of the setting of this configuration bit, the four-bytes of the CRC value will always be used to check the integrity of data in the frame. The configuration bit only affects whether the four-bytes of the CRC value will be transferred as part of the frame after the CRC check operation has been performed. A more detailed description of operation of the present invention will subsequently be provided.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1 illustrates a system environment in accordance with one embodiment to the present invention. The following discussion will provide a general overview of operation of the system environment in which the present invention is implemented. Therefore, the following example will provide a step by step description of operation which illustrates a relationship between LAN 10 and LAN 44 when computer workstation 38 transmits a frame of information to computer workstation 42.

During operation, main processor 16 in computer workstation 38 creates a frame of information in its main memory 18. This frame of information is to be transmitted to computer workstation 42. As created, the frame of information includes a header and an information field, but no CRC value. Main processor 16 signals LAN adapter 12 to enable the transmission of the frame of information onto LAN 10. Additionally, main processor 16 signals LAN adapter 12 to generate and append a valid CRC value to the end of the frame of information.

LAN adapter 20, in computer 40, recognizes that the destination of the frame is on LAN 44. Therefore, computer 40 copies the frame of information into its main memory 28. LAN adapter 20 uses a CRC value at the end of the frame to check the integrity of the frame data. In addition, its "Receive CRC Configuration Bit" (not illustrated in FIG. 1) is set to enable the frame data, along with the CRC value, to be copied into main memory 28. It is the use and implementation of the Receive CRC Configuration Bit that is the subject of the present invention.

Upon receiving the frame, main processor 26 of computer 40 enables LAN adapter 22 to transmit the frame onto LAN 44, while re-using the CRC value that is already appended to the end of the frame. No new CRC value is generated by computer 40. Stated another way, the CRC value used on LAN 20 is passed to LAN 44.

LAN adapter 30 in computer workstation 42 recognizes that the frame of information is addressed to it and copies the frame of information into main memory 36. LAN adapter 30 uses a CRC value at the end of the frame to check the integrity of the frame data. However, assume that in this case the Receive CRC Configuration Bit within LAN adapter 30 is set to cause only the frame data, without the CRC value, to be copied into main memory 36. Thus, as the CRC value is four bytes long, by setting the Receive CRC Configuration Bit to cause only the frame data, and not the CRC value, to be copied into main memory 36, four bytes of data space may be saved within main memory 36.

In conclusion, computer 40 copies the CRC value into main memory (28), so that computer 40 may retransmit the frame with its original CRC value. However, the receiving computer workstation (42) does not need the CRC value copied into its main memory (36), because it does not have to forward the frame to another LAN and the local LAN adapter has already used the CRC to check the frame data before it was copied into its main memory.

FIG. 2 illustrates a communication system which implements one embodiment of the present invention in greater detail. Communication system 100 of FIG. 2 comprises a network 102, a local area network (LAN) adapter 104, a host bridge logic circuit 120, a main processor 122, and a main memory 124. LAN adapter 104 comprises a receive logic circuit 128, a transmit logic and CRC generator circuit 108, and a bus interface logic circuit 106. Receive logic 128 comprises a receive data de-serializer and CRC checker 116, a receive FIFO (first in first out) write state machine 114, a receive data FIFO 118, and a configuration register 110. Configuration register 110 further comprises a Receive CRC Configuration Bit 112.

Network 102 is coupled to receive data de-serializer and CRC checker 116. Receive data de-serializer and CRC checker 116 is coupled to receive FIFO write state machine 114 and receive data FIFO 118. Receive FIFO write state machine 114 is coupled to receive data FIFO 118 to provide a Write Enable signal. Configuration register 110 is coupled to receive FIFO write state machine 114 to provide the Receive CRC Configuration Bit 112. Receive data FIFO 118 is coupled to bus interface logic 106 to provide a Read Enable signal, a plurality of data values, and a Frame End signal. Bus interface logic 106 is bidirectionally coupled to configuration register 110 and coupled to transmit logic and CRC generator 108. Transmit logic and CRC generator 108 is coupled to network 102. Bus interface logic 106 is bidirectionally coupled to host bridge logic 120 via a system bus 126. Host bridge logic 120 is coupled to main processor 122 and main memory 124 via a processor/memory bus.

Operation of communication system 100 will subsequently be provided in greater detail.

As previously mentioned, local area networks (LANs) allow a group of workstations to communicate with one another via one logical network. As networks grow and more users are connected to a single LAN, multiple LANs may be required to meet the requirements of the additional users. However, inherent in this networking system is a requirement that all users be able to communicate with each other over the network, regardless of which LAN they are connected to. For this reason, a bridge network is required to bridge or route frames of information from one LAN to another.

During operation, such a bridge network evaluates frames transferred by both LANs and determines which of data are destined for a user on a local LAN and which frames of data are destined for a user on the other LAN. When the data is to be communicated with a user on the other LAN, the bridge network copies that information and supplies it to the other LAN to provide it to the ultimate station to which it is addressed. When performing this forwarding operation, a cyclic redundancy check (CRC) value is utilized to ensure that correct data is being forwarded between the LANs, and ultimately to the final user.

As previously mentioned, a CRC value generally comprises four bytes of data following an information field. This protocol is defined for many local area networks, such as Ethernet, Token-Ring, and FDDI (Fiber Distributed Data Interface). The CRC value is basically a protection mechanism which allows a LAN or a LAN adapter to determine when data in a frame of information being transmitted has been corrupted. During operation, when the CRC is copied from a first LAN to a second LAN as a frame of data is copied, that CRC value is used to check the data to make sure that it has been transferred without corruption. Therefore, when a data message is transferred from a first LAN having a first LAN adapter to a second LAN having a second LAN adapter, the data is transmitted in a frame, along with the CRC value, that ensures communications between two different LANs are successful and correct. After the data and CRC value are passed from the local LAN to a destination LAN, the CRC value will be checked by the LAN adapter connected by the destination LAN. After the CRC value has been checked, the CRC value can be deleted. Therefore, software within the destination LAN should only be required to transfer the data portion to internal memory therein.

Therefore, while some specific applications, like "bridges" that interconnect two LAN segments require the CRC value to be provided, a majority of applications do not require this information. Furthermore, although it is not needed in many applications, existing LAN adapters copy four bytes of the CRC value into a host computer system's main memory for every frame received from the network to be able to correctly transfer data on those situations that do require CRC value. Such prior art LAN adapters waste system bus and memory bandwidth. Additionally, the provision of CRC data into the host computer system's main memory also creates more overhead for device driver software controlling the communication system, since the device driver software must delete the CRC data before the frame is delivered to its application.

Thus, the present invention provides a technique for optionally deleting the CRC data from a frame of information as the frame is copied by a LAN adapter into a host computer system's main memory. Through the optional deletion of the CRC value, the present invention is designed to improve the LAN adapter's performance in applications where the CRC data is not needed, by eliminating unnecessary system bus and main memory transfers. Furthermore, overhead associated with the device driver software controlling a communication system which implements the present invention is reduced, as the device driver software is not required to delete the four bytes of the CRC data before providing the data onward.

The present invention implements a CRC configuration bit in a configuration register within the LAN adapter hardware. It should be known, however, that the LAN adapter may be implemented either in a discrete device, or as circuitry on a host bridge logic circuit, such as host bridge logic circuit 120, main processor 122, or main memory 124. Device driver software within the LAN adapter configures the CRC configuration bit during an initialization stage of operation prior to active use of the LAN and LAN adapter. The use of this configuration bit within communication system 100 of the present invention will subsequently be described in greater detail.

Refer now to FIG. 2. During operation of communication system 100 of FIG. 2, main processor 122 executes device driver software to configure Receive CRC Configuration Bit 112. The device driver software may be stored internally within main processor 122 or may be accessed from main memory 124 via the processor/memory bus. The data is transferred through host bridge logic circuit 120. It should be noted that host bridge logic 120 provides a bridging function between the processor/memory bus and system bus 126. Through the use of host bridge logic circuit 120, a function may be executed on both system bus 126 and the processor/memory bus concurrently. Host bridge logic circuit 120 also transfers data from one bus to the other, when data needs to be transferred from a device on one side of host bridge logic circuit 120 to LAN adapter 104. In this operation, host bridge logic circuit 120 transfers a write command from main processor 122 to system bus 126. The write command is subsequently transferred from bus interface logic 106 to enable control register 110 to be written with Receive CRC Configuration Bit 112. A logic state of Receive CRC Configuration Bit 112 is determined by the command issued by main processor 122. The steps required to write modify a bit value within a configuration register is well-known to those with skill in the relevant data processing art and, therefore, will not be described in greater detail herein.

After Receive CRC Configuration Bit 112 has been written to a logic value desired by an external user programming the device driver software, LAN adapter 104 is capable of either copying or deleting the CRC value in all frames of data as it is copied by LAN adapter 104 into main memory 124.

It should be noted that LAN adapter 104 includes both receive logic 128 and transmit logic and CRC generator 108. Through the inclusion of both receive and transmit capabilities, LAN adapter 104 operates as a bus master on system bus 126 by reading data from and writing data to main memory 124 via host bridge logic circuit 120. As previously mentioned, LAN adapter 104 performs such transfer operations under the direction of device driver software executing on main processor 122. LAN adapter 104 transmits frames of information by reading data from buffers (not illustrated) in main memory 124, and, then, sending the data over network (LAN) 102 to other LAN adapters (not illustrated herein). Additionally, LAN adapter 104 receives frames of information from other LAN adapters on network 102 and deposits this information into buffers in main memory 124.

Assume that LAN adapter 104 is receiving information from other LAN adapters within network 102. As data is received from network 102, the data is serially provided to receive data de-serializer and CRC checker 116. The receive data de-serializer and CRC checker 116 forms the serial information transmitted thereto into multi-bit data values which may be transmitted in parallel to receive data FIFO 118. It should be noted that in one embodiment of the present invention, receive data de-serializer and CRC checker circuit 116 forms the serial information stream provided thereto into 32-bit units. However, it should be well-known to those with skill in the data processing art that the serial data provided from network 102 may be placed within any number of units of parallel data.

When thirty-two bits of data are available from receive data de-serializer and CRC checker 116, receive FIFO write state machine 114 activates a Write Enable signal, which is provided to receive data FIFO 118. Upon receipt of the Write Enable signal in a pre-determined logic state, receive data FIFO 118 stores the 32-bit data value in its internal FIFO (first in first out) queue, until it can be read by bus interface logic 106. Bus interface 106 will then provide the 32-bit data value to main memory 124 via system bus 126 and host bridge logic circuit 120.

As a frame of information is received from network 102, receive data de-serializer and CRC checker 116 places the serial data values into parallel data units. Additionally, receive data de-serializer and CRC checker 116 performs a cyclic redundancy check (CRC) calculation on a preselected portion of the data to determine whether the data was corrupted during the transmission operation. Receive data de-serializer and CRC checker 116 performs this function by comparing a calculated CRC value to four bytes of a CRC value appended to the end of the frame by a transmitting LAN adapter within network 102. If the calculated CRC value and the CRC value received in the frame do not match, receive data de-serializer and CRC checker 116 provides a CRC error signal to receive FIFO write state machine 114. Receive FIFO write state machine 114 selectively provides the CRC error signal to indicate that a CRC error has been detected for a current frame being received. Receive data FIFO 118 subsequently provides a CRC error signal to bus interface logic 106 to notify the device driver software within main processor 122. Device driver software then performs an error compensation function which is well-known in the data processing industry and, therefore, will not be described in greater detail herein.

Furthermore, during operation, configuration register 110 provides a Receive CRC Configuration Bit 112 to receive FIFO write state machine 114. The Receive CRC Configuration Bit 112 is used by receive FIFO write state machine 114 to determine whether the CRC information received by receive data de-serializer and CRC checker 116 should be copied into main memory 124 after a CRC check operation is performed. If the CRC value should not be copied into main memory 124, the CRC value will be discarded or omitted from the data that is moved into main memory 124.

As previously mentioned, it should be noted when LAN adapter 104 is operating in a bridging mode, Receive CRC Configuration Bit 112 will be in a first preselected logic state. In such a mode, CRC data is required to be transferred between network 102 and another LAN. In this mode of operation, the CRC value is copied along with the frame to the destination LAN to ensure that no errors have occurred in transmission of the information. Conversely, when Receive CRC Configuration Bit 112 is in a second preselected logic state, the LAN adapter is operating in a non-bridging environment and CRC data does not need to be copied along with the frame since the frame has already reached its final destination and the destination LAN adapter checks the integrity of the frame before copying the data into the destination computer's main memory.

FIG. 3 provides a flow chart of the methodology implemented by receive FIFO write state machine 114 to selectively use Receive CRC Configuration Bit 112 to provide CRC data only when required by an application receiving the data from LAN adapter 104. During operation, receive FIFO write state machine 114 continues to monitor receive data de-serializer and CRC checker 116. Additionally, receive FIFO write state machine 114 determines when 32-bits of data have been provided from network 102 to receive data de-serializer and CRC checker 116 in a step 202. If 32-bits of data are not available from network 102, a program flow returns to step 200. However, if 32-bits of data are available from network 102, receive FIFO write state machine 114 determines whether the 32-bits of data are the CRC data at the end of a frame in a step 204. Receive FIFO write state machine 114 receives three signals from receive data de-serializer and CRC check 116. A first one of these signals indicates that another 32-bits of data have arrived from network 102. An "end of frame" signal is also provided to indicate the data currently available is the end of a frame. As previously indicated, the CRC bytes are always at the end of the frame. Additionally, receive FIFO write state machine 114 receives a "CRC error" signal from receive data de-serializer and CRC checker 116. The CRC error signal indicates when a CRC error has been detected for a current frame. If the 32-bits of data is not the CRC data at the end of a frame, a Write Enable signal is asserted to enable receive data FIFO 118 to write the 32-bit data value therein in a step 214. A program flow subsequently returns to step 200.

However, if the data is the CRC data at the end of a frame, receive FIFO write state machine 114 evaluates the CRC error signal to determine whether the CRC check of the frame data was successfully completed in a step 206. In a step 216, if the CRC check of the frame data did not complete successfully, receive FIFO write state machine 114 provides three signals to receive data FIFO 118 to indicate that a CRC error has occurred and the frame was transmitted erroneously. These three signals include a "write enable" signal, an "end of frame" signal, and a "CRC error" signal. The write enable signal causes 32 bits of data to be captured and receive data FIFO 118. The end of frame signal indicates to receive data FIFO 118 that all data for the current frame has been written thereto. Furthermore, the CRC error signal indicates to receive data FIFO 118 that a CRC error was detected for a current frame.

After completion of the CRC check of the frame data in step 206, a step 208 is executed to determine whether Receive CRC Configuration Bit 112 is in a predetermined logic state which enables copying of the CRC data. If yes, the write enable signal is asserted such that receive data FIFO 118 stores the CRC data value therein in a step 210. However, if the configuration bit is not set to enable copying of CRC data, as the application does not require this information, the write enable signal provided by receive FIFO write state machine 114 is disabled.

Subsequently, receive data FIFO 118 is signalled that the end of a frame has been reached in the step 212 using the previously described end of frame signal.

When receive data FIFO 118 receives confirmation from receive FIFO write state machine 114 that an entire frame has been received, receive data FIFO 118 records a FIFO position that stores a last data value of the frame. Subsequently, when bus interface logic 106 reads a final frame data value from receive data FIFO 118, logic within receive data FIFO 118 signals an end of a frame of information. Bus interface logic 106 maintains a count of a number of bytes of data read from receive data FIFO 118 for each frame of information. A total frame byte count is provided to the device driver software executing within main processor 122, such that a record of the data placed in buffers (not illustrated in detail) in main memory 124 is established. If Receive CRC Configuration Bit 112 is set to a predetermined logic level which indicates that the CRC value should be deleted from the frame information, a resulting byte count for data stored in main memory 124 will be four bytes less than if the CRC value is copied into main memory 124 as the final four bytes of the frame.

It should be noted that the optional deletion of the CRC value through the use of Receive CRC Configuration Bit 112 within configuration 110 is transparent to receive data FIFO 118 and bus interface logic 106.

Thus, the present invention provides a communication system and method of operation which allows for the selective receipt of CRC data in a memory system coupled to a LAN adapter. This selectivity is determined through the use of a CRC configuration bit which determines whether the four-bytes of the CRC data are included at the end of the frame data received from a LAN adapter. Additionally, regardless of the setting of the CRC configuration bit, the four-bytes of CRC data will always be used to check the integrity of the data in a frame of information. Thus, the CRC configuration bit only affects whether the four-bytes of CRC data will be transferred as part of the frame after the CRC check has been performed. By providing this ability, the functionality of the communication system is not sacrificed, but a performance increase is obtained.

Furthermore, the implementation of the invention provided herein is provided by way of example only, however, and many other implementations may exist for executing the functions described herein. For example, the present invention could be applied to any communication protocol that defines a frame format including a CRC value at the end. Additionally, it should be noted that the present invention may be implemented in a variety of manners. For example, rather than having a hardware "state machine" that decides when to delete the CRC value, a network adapter could include a microprocessor and memory. Software running on the microprocessor could delete the CRC from the frame while it resides in the adapter's memory. The frame would then be transferred from the adapter's memory to the main memory of the host computer system with the CRC data deleted. Additionally, it should be noted that other alternate embodiments of the present invention also exist.

While there have been described herein the principles of the invention, it is to be clearly understood to those skilled in the art that this description is made by way of example only and not as a limitation to the scope of the invention. Accordingly, it is intended, by the appended claims, to cover all modifications of the invention which fall within the true spirit and scope of the invention.

What is claimed is:

1. A local area network adapter, comprising:
    input means for receiving a first plurality of information values;
    output means for selectively transferring the first plurality of information values;
    a configuration register for storing a configuration value, the configuration value being used to selectively enable the output means to transfer a portion of the first plurality of information values when the configuration value is in a first logic state; and
    a state machine coupled to the configuration register for receiving the configuration value and coupled to the input means for receiving an input control signal, the state machine generating an output control signal in response to the configuration value and the input control signal.

2. The local area network adapter of claim 1, wherein the configuration value selectively enables the output means to transfer each of the first plurality of information values when the configuration value is in a second logic state.

3. The local area network adapter of claim 1, wherein the state machine is coupled to the output means for providing the output control signal, the output control signal selectively enabling the output means to provide at least a portion of the first plurality of information values.

4. The local area network of claim 1 wherein the first plurality of information values, further comprises:
    a data value; and
    a cyclic redundancy check value.

5. The local area network adapter of claim 4, wherein the configuration value selectively enables the output means to transfer the data value and the cyclic redundancy check value when the configuration value is in a second logic state.

6. The local area network adapter of claim 1 wherein the input means, further comprises:
    means for performing a cyclic redundancy check function, wherein the means for performing the cyclic redundancy check function ensures that the plurality of information values were transferred to the input means correctly.

7. The local area network adapter of claim 1 wherein the output means, further comprises:
    first-in, first-out storage means for storing at least a portion of the plurality of information values in a parallel format.

8. A local area network adapter, comprising:
    input means for receiving a first plurality of information values;
    output means for selectively transferring the first plurality of information values;
    a configuration register for storing a configuration value, the configuration value being used to selectively enable the output means to transfer a portion of the first plurality of information values when the configuration value is in a first logic state, wherein the first plurality of information values further comprises:
    a data value; and
    a cyclic redundancy check value,
    wherein the configuration value selectively enables the output means to refrain from transferring the cyclic redundancy check value when the configuration value is in the first logic state.

9. A method of operating a local area network adapter, comprising the steps of:
    receiving a first plurality of information values;
    storing a configuration value in a register;
    selectively enabling an output circuit to transfer a portion of the first plurality of information values when the configuration value is in a first logic state;
    generating an output control signal in response to the configuration value and the input control signal using a state machine;
    providing the output control signal to the output circuit; and
    selectively enabling the output circuit to provide at least a portion of the first plurality of information values.

10. The method of claim 9, further comprising the step of:
    selectively enabling the output circuit to transfer each of the first plurality of information values when the configuration value is in a second logic state.

11. The method of claim 9 wherein the first plurality of information values further comprises a data value and a cyclic redundancy check value.

12. The method of claim 11, further comprising the step of:
    selectively enabling the output circuit to transfer the data value and the cyclic redundancy check value when the configuration value is in a second logic state.

13. The method of claim 9, further comprising the step of:
performing a cyclic redundancy check function to ensure that the plurality of information values were transferred to the input means correctly.

14. The method of claim 9 further comprising the step of:
storing of at least a portion of the plurality of information values in a parallel format in a first-in, first-out storage means.

15. A method of operating a local area network adapter, comprising the steps of:
receiving a first plurality of information values;
storing a configuration value in a register;
selectively enabling an output circuit to transfer a portion of the first plurality of information values when the configuration value is in a first logic state,
wherein the first plurality of information values further comprises a data value and a cyclic redundancy check value; and
selectively enabling the output circuit to refrain from transferring the cyclic redundancy check value when the configuration value is in the first logic state.

16. A communication system, comprising:
a first local area network adapter, comprising:
input means for receiving a first plurality of information values;
output means for selectively transferring a second plurality of information values; and
a first configuration register for storing a first configuration value, the first configuration value enabling the output means to transfer a portion of the first plurality of information values as the second plurality of information values when the first configuration value is in a first logic state; and
a memory coupled to the output means for storing the second plurality of information values, wherein the first plurality of information values comprises a data value and a cyclic redundancy check value, wherein the portion of the first plurality of information values transferred as the second plurality of information values includes only the data value.

17. The communication system of claim 16 wherein the first configuration value selectively enables the output means to transfer the data value and the cyclic redundancy check value as the second plurality of information values when the first configuration value is in a second logic state.

18. The communication system of claim 16, further comprising:
a first data processing system for providing the first plurality of information values, wherein the first plurality of information values comprises a first data value and a first cyclic redundancy check value.

19. A first local area network adapter, comprising:
input means for receiving a first plurality of information values;
output means for selectively transferring a second plurality of information values;
a first configuration register for storing a first configuration value, the first configuration value enabling the output means to transfer a portion of the first plurality of information values as the second plurality of information values when the first configuration value is in a first logic state; and
a memory coupled to the output means for storing the second plurality of information values, wherein the first plurality of information values comprises a data value and a cyclic redundancy check value;
a first data processing system for providing the first plurality of information values, wherein the first plurality of information values comprises a first data value and a first cyclic redundancy check value; and
a bridge data processing system, comprising:
a second local area network adapter coupled to the first data processing system for receiving the first data value and the first cyclic redundancy check value, the second local area network adapter comprising:
a first cyclic redundancy check circuit for checking the first cyclic redundancy check value to ensure the first data value is transmitted correctly;
a first bridge output circuit for selectively transferring one or both of the first data value and the first cyclic redundancy check value;
a second configuration register for storing a second configuration value, the second configuration value selectively enabling the first bridge output circuit to transfer both the first data value and the first cyclic redundancy check value when the second configuration value is in a second logic state; and
a third local area network adapter coupled to the bridge output circuit for receiving the first data value and the first cyclic redundancy check value, the third local area network adapter coupled to the first local area network adapter to selectively provide the first data value and the first cyclic redundancy check value as the plurality of information values.

20. The communication system of claim 19 wherein the output means of the first local area network adapter refrains from transferring the first cyclic redundancy check value when the first configuration value is in the first logic state.

21. A method for generating a communication system, comprising the steps of:
receiving a first plurality of information values in a first local area network adapter;
storing a first configuration value in a first configuration register in the first local area network adapter;
enabling an output means to transfer a portion of the first plurality of information values as a second plurality of information values when the first configuration value is in a first logic state; and storing the second plurality of information values in a memory, wherein the first plurality of information values comprises a data value and a cyclic redundancy check value, wherein the portion of the first plurality of information values transferred as the second plurality of information values includes only the data value.

22. The method of claim 21, further comprising the step of:
selectively enabling the output means to transfer the data value and the cyclic redundancy check value as the second plurality of information values when the first configuration value is in a second logic state.

23. The method of claim 21, further comprising the steps of:
providing the first plurality of information values from a first data processing system, wherein the first plurality of information values comprises a first data value and a first cyclic redundancy check value.

24. A method for operating a communication system, comprising the steps of:
receiving a first plurality of information values in a first local area network adapter;
storing a first configuration value in a first configuration register in the first local area network adapter;

enabling an output means to transfer a portion of the first plurality of information values as a second plurality of information values when the first configuration value is in a first logic state;

storing the second plurality of information values in a memory, wherein the first plurality of information values comprises a data value and a cyclic redundancy check value;

providing the first plurality of information values from a first data processing system, wherein the first plurality of information values comprises a first data value and a first cyclic redundancy check value;

coupling a second local area network adapter to the first data processing system to receive the first data value and the first cyclic redundancy check value;

enabling a first cyclic redundancy check circuit in the second local area network to check the first cyclic redundancy check value to ensure the first data value is transmitted correctly;

selectively transferring one or both of the first data value and the first cyclic redundancy check value using a first bridge output circuit;

storing a second configuration value in a second configuration register;

selectively enabling the first bridge output circuit to transfer both the first data value and the first cyclic redundancy check value when the second configuration value is in a second logic state;

coupling a third local area network adapter to the bridge output circuit to receive the first data value and the first cyclic redundancy check value; and selectively enabling the third local area network adapter to provide the first data value and the first cyclic redundancy check value as the plurality of information values.

25. The method of claim 24, further comprising the step of:

refraining from transferring the first cyclic redundancy check value when the first configuration value is in the first logic state.

* * * * *